(12) United States Patent
Oh et al.

(10) Patent No.: US 7,190,202 B1
(45) Date of Patent: Mar. 13, 2007

(54) TRIM UNIT HAVING LESS JITTER

(75) Inventors: Kwansuhk Oh, San Jose, CA (US); Raymond C. Pang, San Jose, CA (US)

(73) Assignee: Xilink, Inc., San Jose, CA (US)

( * ) Notice: Subject to any disclaimer, the term of this patent is extended or adjusted under 35 U.S.C. 154(b) by 70 days.

(21) Appl. No.: 11/099,908

(22) Filed: Apr. 5, 2005

(51) Int. Cl.
*H03L 7/00* (2006.01)

(52) U.S. Cl. ...................... 327/161; 327/158

(58) Field of Classification Search ............ None
See application file for complete search history.

(56) References Cited

U.S. PATENT DOCUMENTS

| | | | | |
|---|---|---|---|---|
| 5,101,117 | A * | 3/1992 | Johnson et al. ............. | 327/149 |
| 5,550,514 | A * | 8/1996 | Liedberg ..................... | 331/1 A |
| 5,946,268 | A * | 8/1999 | Iwamoto et al. ............ | 365/233 |
| 5,963,074 | A * | 10/1999 | Arkin ......................... | 327/276 |
| 6,204,710 | B1 * | 3/2001 | Goetting et al. ............ | 327/276 |
| 6,327,318 | B1 * | 12/2001 | Bhullar et al. .............. | 375/374 |
| 6,351,169 | B2 * | 2/2002 | Kuge .......................... | 327/161 |
| 6,377,101 | B1 * | 4/2002 | Eto et al. .................... | 327/270 |
| 6,420,987 | B1 * | 7/2002 | Schoner et al. ............. | 341/143 |
| 6,518,812 | B1 * | 2/2003 | Sikkink et al. ............. | 327/284 |
| 6,664,837 | B1 | 12/2003 | Oh et al. | |
| 6,700,434 | B2 * | 3/2004 | Fujii et al. .................. | 327/534 |
| 6,750,688 | B2 * | 6/2004 | Takai ......................... | 327/158 |
| 6,788,124 | B1 * | 9/2004 | Kaviani ...................... | 327/276 |
| 6,987,405 | B1 * | 1/2006 | Reaves ....................... | 327/149 |
| 2003/0169838 | A1 * | 9/2003 | Greenstreet et al. ........ | 375/376 |
| 2005/0024107 | A1 * | 2/2005 | Takai et al. ................. | 327/158 |

OTHER PUBLICATIONS

U.S. Appl. No. 10/837,186, filed Apr. 30, 2004, Morrison et al.

* cited by examiner

*Primary Examiner*—Timothy P. Callahan
*Assistant Examiner*—Cassandra Cox
(74) *Attorney, Agent, or Firm*—William L. Paradice, III

(57) ABSTRACT

A trim unit includes a delay line and one or more individually selectable load elements. The delay line has a first end to receive an input clock signal, and has a second end to generate an output clock signal. Each load element includes a select transistor and a load capacitor coupled in series between the delay line and ground potential, and includes a filter circuit having an input to receive a select signal and having an output coupled to a gate of the select transistor. Upon assertion of each select signal, the filter circuit gradually charges the gate of the select transistor, which in turn causes the load element to gradually increase the phase-delay between the input and output clock signals.

17 Claims, 7 Drawing Sheets

TRIM UNIT HAVING LESS JITTER

FIELD OF INVENTION

This invention relates generally to clock signals for integrated circuit (IC) devices, and in particular to reducing clock jitter associated with delay-locked loop (DLL) circuits.

DESCRIPTION OF RELATED ART

Synchronous digital systems rely upon one or more clock signals to synchronize the operation of various circuit elements distributed across the system. The one or more clock signals are typically distributed across the system via a clock distribution network having one or more clock lines. However, as modern digital systems become larger and more complex, quality on-chip clock distribution becomes increasingly important. For example, because of clock buffer delays, signal propagation delays, and capacitive loading on the clock lines associated with the clock distribution network, the triggering edges of a clock signal in different parts of the system may not be properly synchronized. The time difference between a triggering clock edge in one part of the system and the triggering clock edge in another part of the system, which is commonly known as clock skew, can cause system malfunction.

Delay-locked loop (DLL) circuits are often used to minimize clock skew in digital systems by sufficiently delaying a clock signal before applying it to the clock distribution network so that it is synchronized (e.g., in-phase) with a local clock signal provided by the clock distribution network. For example, FIG. 1 shows an exemplary digital system 100 having a DLL circuit 110 coupled to one or more logic circuits 130 via a clock distribution network 120. DLL circuit 110 includes a programmable delay line 111 and a phase detector 112. An input clock signal CLK_IN is coupled to input terminals of delay line 111 and phase detector 112. Delay line 111 outputs a delayed clock signal CLK_OUT that is provided as an input clock signal to clock distribution network 120. CLK_OUT is routed across clock distribution network 120, which provides CLK_OUT as a local clock signal CLK_LOCAL to logic circuits 130 and provides CLK_OUT as a feedback clock signal CLK_FB to phase detector 112. Phase detector 112 compares the respective phases of CLK_IN and CLK_FB to generate a control signal CTRL indicative of the phase-delay between CLK_IN and CLK_FB. In response to CTRL, delay line 111 delays CLK_OUT until CLK_OUT is synchronous (e.g., in-phase) with CLK_IN. Once the clock signals are in-phase, DLL circuit 110 "locks" and thereafter maintains a constant phase relationship between CLK_OUT and CLK_IN.

A DLL circuit's delay line typically includes a tap unit and a trim unit. The tap unit typically includes a plurality of buffer stages that may be individually selected to delay a clock signal by relatively large delay amounts. The trim unit typically includes a plurality of load elements that may individually selected to delay the clock signal by relatively small delay amounts. As known in the art, the tap and trim units of a delay line may be used together to provide accurate phase-delay adjustments for the clock signal.

For example, FIG. 2 shows a programmable delay line 200 that includes a tap unit 210 and a trim unit 220. Tap unit 210 includes a plurality of individually selectable buffer stages 211(1)–211(3) and a multiplexer circuit (MUX) 212. Although shown in FIG. 2 as including only three buffer stages 211(1)–211(3) for simplicity, tap unit 210 may include any suitable number of buffer stages 211. Buffer stages 211(1)–211(3) are connected in series between delay tap T0 and delay tap T3, where the input of first buffer stage 211(1) receives CLK_IN, and the output of buffer 211(3) is coupled to tap T3. The delay taps T0–T3 are coupled to corresponding inputs of MUX 212. MUX 212, which may be any suitable signal multiplexing circuit, includes an output coupled to an input of trim unit 220 and includes a control terminal to receive CTRL. The control signal CTRL, which may be generated by a phase detector such as phase detector 112 of FIG. 1, selects from which of delay taps T0–T3 the clock signal CLK_IN is provided to the output of MUX 212.

For purposes of discussion herein, each buffer stage 211 provides signal delay of 80 pico-seconds (ps), and MUX 212 provides a negligible signal delay. Thus, selecting tap T0 causes tap unit 210 to provide CLK_IN as CLK_INT to trim unit 220, selecting tap T1 causes tap unit 210 to phase-delay CLK_INT by 80 ps with respect to CLK_IN, selecting tap T2 causes tap unit 210 to phase-delay CLK_INT by 160 ps with respect to CLK_IN, and selecting tap T3 causes tap unit 210 to phase-delay CLK_INT by 240 ps with respect to CLK_IN. Buffer stages 211(1)–211(3) may be any suitable buffer circuits or delay elements, for example, such as CMOS inverters.

Trim unit 220 includes an input buffer 221, an output buffer 222, and four individually selectable load elements 223(0)–223(3). For other embodiments, trim unit 220 may include other numbers of load elements 223. Input buffer 221 includes an input coupled to the output of MUX 212, and an output coupled to an input of output buffer 222 via a delay line 224. Output buffer 222 includes an output to generate CLK_OUT. Buffers 221 and 222 are typically CMOS inverters, although other circuits may be used for buffers 221 and 222. Each load element 223 includes an NMOS select transistor MN and a load capacitor CL coupled between delay line 224 and ground potential, with the gate of the select transistor MN controlled by a corresponding select signal S. The select signals S0–S3, which are typically derived from CTRL, may be used in a well-known manner to selectively enable load elements 223(0)–223(3), respectively. When enabled, each load element 223 couples its load capacitor CL between delay line 224 and ground potential, thereby increasing the capacitive load on delay line 224 and thus also increasing the signal delay of CLK_OUT on delay line 224. The amount by which each load element 223 delays CLK_OUT on delay line 224 is determined by the load capacitance of its load capacitor CL.

For purposes of discussion herein, the load capacitors are fabricated so that when enabled, each load element 223 increases the phase-delay between CLK_OUT and CLK_IN by 16 ps. Thus, the phase-delay of CLK_OUT may be increased by 16 ps by enabling one load element 223, the phase-delay of CLK_OUT may be increased by 32 ps by enabling two load elements 223, the phase-delay of CLK_OUT may be increased by 48 ps by enabling three load elements 223, and the phase-delay of CLK_OUT may be increased by 64 ps by enabling all load elements 223. In this manner, trim unit 220 allows for incremental phase-delay adjustments between adjacent tap selections of tap unit 210. For example, delay line 200 may achieve a phase-delay between CLK_OUT and CLK_IN of 112 ps by selecting tap T1 of tap unit 210 (e.g., for a 1*80=80 ps tap adjustment) and by enabling two load elements 223 of trim unit 220 (e.g., for a 2*16=32 ps trim adjustment).

Although including trim unit 220 in the delay line allows for more precise phase-delay adjustments, changing the number of load elements 223 that are enabled during trim adjustments often results in clock jitter, which may adversely affect the performance of associated circuitry (e.g., such as logic circuits 130 of FIG. 1) coupled to the delay line. For example, referring to the illustrative waveform diagram of FIG. 3, at time t0, there is a phase-delay of X between CLK_OUT and CLK_IN, and the de-asserted states of select signals S0–S3 disable corresponding load elements 223(0)–223(3) so that trim unit 220 initially does not provide any phase-delay adjustments. At time t1, select signal S0 is asserted from logic low to logic high (e.g., from ground potential to the supply voltage VDD) to enable load element 223(0).

The assertion of S0 from logic low to logic high is fairly instantaneous, as depicted by the step function for S0 in FIG. 3. The assertion of S0 rapidly charges the gate of select transistor MN0, which immediately turns on and quickly charges load capacitor CL0. The rapid charging of the load capacitor causes the phase-delay between CLK_OUT and CLK_IN to quickly increase by a delay amount D. The increase in phase-delay from X to X+D is fairly instantaneous, as depicted by the step function for the delay waveform in FIG. 3. Unfortunately, increasing the phase-delay between CLK_OUT and CLK_IN in a fairly instantaneous manner (e.g., depicted in FIG. 3 as occurring within one clock period) typically results in undesirable jitter that, as known in the art, may degrade performance and/or even cause failure of associated circuitry coupled to CLK_OUT.

Therefore, there is a need for a trim unit suitable for use in a delay line of a DLL circuit or PLL circuit that minimizes jitter of a clock signal during phase-delay adjustments of the clock signal.

SUMMARY

In some embodiments of the invention a method and apparatus are disclosed that selectively adjust the phase-delay between an input clock signal and an output clock signal in a manner that minimizes jitter during phase-delay adjustments. In accordance with one embodiment of the present invention, a trim unit suitable for use within a DLL circuit or a PLL circuit includes a delay line and one or more individually selectable load elements. The delay line is coupled between the input clock signal and the output clock signal. Each load element includes a select transistor and a load capacitor coupled in series between the delay line and ground potential, and includes a filter circuit having an input to receive a corresponding select signal and having an output coupled to a gate of the select transistor. Upon assertion of each select signal, the filter circuit gradually charges the gate of the select transistor to gradually turn on the select transistor, thereby gradually charging the load capacitor so that the load element gradually increases the phase-delay between the output clock signal and the input clock signal in response to assertion of the select signal. In this manner, embodiments of the present invention may be used to gradually adjust the phase-delay between the output clock signal and the input clock signal, for example, over a sufficient number of clock cycles so that jitter caused by such phase-delay adjustments is minimized.

For some embodiments, the rate at which the gate voltage of the select transistor charges and discharges in response to logic state transitions of the select signal, and thus the rate at which the load element adjusts the phase-delay between the output clock signal and the input clock signal, is determined by the resistor-capacitor (RC) time constant of the filter circuit. In this manner, the time required for each load element to implement its corresponding phase-delay adjustment may be controlled by selecting appropriate values for the resistor and capacitor that form the filter circuit.

When the trim unit is combined with a tap unit to form a delay line, the relatively slow rate at which the trim unit adjusts the phase-delay may cause undesirable spikes in the phase-delay during concurrent tap and trim adjustments. Thus, in accordance with another embodiment of the present invention, a trim circuit suitable for use with a tap unit includes first and second trim units of the type described above, and includes a multiplexer (MUX). The first trim unit includes a first delay line having a first end to receive the input clock signal from the tap unit and having a second end coupled to a first input of the MUX, and includes a number of first load elements coupled between the first delay line and ground potential. The second trim unit includes a second delay line having a first end to receive the input clock signal from the tap unit and having a second end coupled to a second input of the MUX, and includes a number of second load elements coupled between the second delay line and ground potential. The MUX includes an output to generate the output clock signal, and a control terminal to receive a trim select signal.

In accordance with an embodiment of the present invention, the first and second trim units may be alternately selected by the MUX in response to the trim select signal to provide trim adjustments between alternating pairs of tap selections in the tap unit. Thus, for some embodiments, the first trim unit may be selected for trim adjustments when an odd number of taps in the tap unit are selected, and the second trim unit may be selected for trim adjustments when an even number of taps in the tap unit are selected. When not selected for trim adjustments, each trim unit is reset to provide a minimum (e.g., zero) delay output by disabling its corresponding load elements.

For example, when the first tap of the tap unit is selected, the first trim unit may be selected to provide trim adjustments, and the second trim unit is maintained in a state that provides a zero delay at its output. When selected, the first trim unit may increase the phase-delay by enabling increasing numbers of its load elements until a maximum trim adjustment is reached. Then, to achieve further phase-delay increases, the second tap of the tap unit is selected, the second trim unit is selected for trim adjustments by toggling the trim select signal, and the first trim unit is reset to provide a zero delay by disabling its load elements. Thereafter, the second trim unit may increase the phase-delay by enabling increasing numbers of its load elements until a maximum trim adjustment is reached. Because the first trim unit provides a maximum delay and the second trim unit provides a minimum delay prior to the tap selection change, toggling the trim select signal to de-select the first trim unit and to select the second trim unit during the tap adjustment allows the trim adjustment to decrease from the maximum delay to the minimum delay in a fairly instantaneous manner, thereby eliminating undesirable spikes in phase-delay during concurrent tap and trim adjustments.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

An embodiment of the present invention is applicable to a variety of integrated circuits and systems. An embodiment of the present invention has been found to be particularly applicable and beneficial for providing phase-delay adjustments for delay-locked loop (DLL) circuits and phase-locked loop (PLL) circuits. Thus, although some aspects of the present invention are described below with respect to an exemplary DLL circuit, it is to be understood that embodiments of the present invention are equally applicable to other DLL architectures and/or to various PLL circuits.

In the following description, for purposes of explanation, specific nomenclature is set forth to provide a thorough understanding of the present invention. In other instances, well-known circuits and devices are shown in block diagram form to avoid obscuring the present invention. Further, the logic levels assigned to various signals in the description below are arbitrary, and thus can be modified (e.g., reversed polarity) as desired. Accordingly, the present invention is not to be construed as limited to specific examples described herein but rather includes within its scope all embodiments defined by the appended claims.

Figure 4:
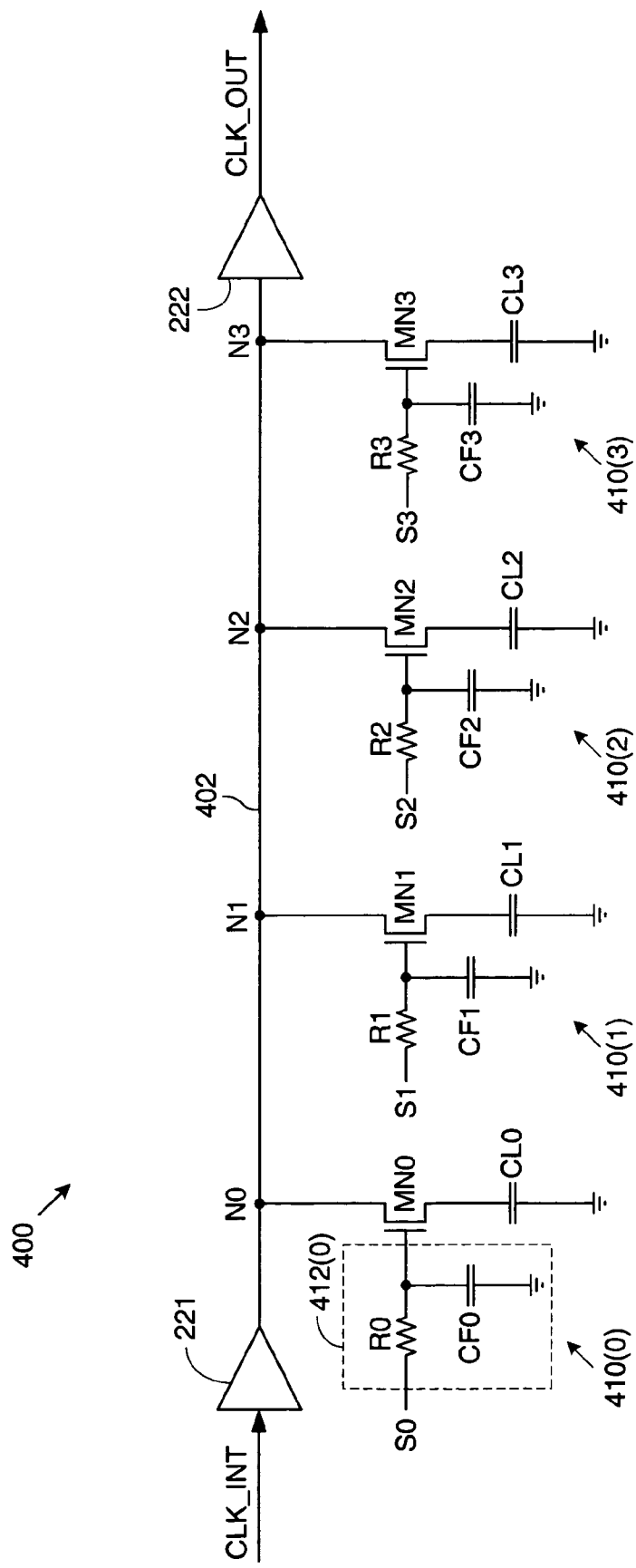
FIG. 4 is a circuit diagram of a trim unit in accordance with some embodiments of the present invention.

FIG. 4 shows a trim unit 400 in accordance with some embodiments of the present invention. Trim unit 400 includes input buffer 221, output buffer 222, a delay line 402, and four individually selectable load elements 410(0)–410(3). Although the exemplary embodiment of FIG. 4 is shown to include four load elements 410(0)–410(3), for other embodiments, trim unit 400 may include any suitable number of load elements 410. Input buffer 221 includes an input to receive an input clock signal CLK_IN, and an output coupled to the input of output buffer 222 via delay line 402. Output buffer 222 includes an output to generate an output clock signal CLK_OUT that be may phase-delayed with respect to CLK_IN by selectively enabling one or more of load elements 410(0)–410(3), as described below. Buffers 221 and 222 may be any suitable buffer circuits. For some embodiments, buffers 221–222 are CMOS inverters, although for other embodiments other circuits may be used to implement buffers 221–222. In one embodiment, trim unit 400 can be part of a DLL in a Programmable Logic Device (PLD), such as, for example, the Virtex Field Programmable Gate Array (FPGA) or Spartan FPGA from Xilinx, Inc. of San Jose, Calif.

Each load element 410 includes an NMOS select transistor MN and a load capacitor CL coupled between delay line 402 and ground potential, with the gate of the select transistor MN coupled to receive a corresponding select signal S via a filter circuit formed by a resistor R and a filter capacitor CF. For exemplary purposes of discussion herein, the load capacitors CL are fabricated so that when enabled, each load element 410 increases the signal delay on delay line 402 by 20 ps, and buffers 221–222 have negligible signal delays. Thus, the phase-delay of CLK_OUT may be increased by 20 ps by enabling one load element 410, the phase-delay of CLK_OUT may be increased by 40 ps by enabling two load elements 410, the phase-delay of CLK_OUT may be increased by 60 ps by enabling three load elements 410, and the phase-delay of CLK_OUT may be increased by 80 ps by enabling all load elements 410. For other embodiments, the load capacitors CL may be configured to have other capacitances that allow each of load elements 410(0)–410(3), when enabled, to increase the clock phase-delay by some other suitable amount.

In accordance with an embodiment of the present invention, the filter circuits decrease the rate at which the load elements 410 adjust the signal delay on delay line 402 so that phase-delay adjustments provided by trim unit 400 are spread out over multiple clock periods. For example, load element 410(0) includes a filter circuit 412(0) formed by a resistor R0 and filter capacitor CF0. Resistor R0 has a first end to receive the select signal S0, and a second end coupled to the gate of select transistor MN0. Filter capacitor CF0 is coupled between the gate of transistor MN0 and ground potential. Together, resistor R0 and filter capacitor CF0 form a low-pass filter that decreases the rate at which load capacitor CL0 adjusts the signal delay on delay line 402 by decreasing the rate at which the gate voltage of transistor MN0 changes in response to logic state changes of S0. Thus, by gradually adjusting the phase-delay between CLK_OUT and CLK_IN (e.g., over a plurality of clock periods), trim unit 400 may reduce clock jitter during trim adjustments, for example, compared to prior art trim unit 220 of FIG. 2.

The rate at which the gate voltage of the select transistor changes in response to logic state changes of the select signal, and thus the rate at which load elements 410 adjust the phase-delay of the clock signal on delay line 402, is determined by the resistor-capacitor (RC) time constant of the load element's filter circuit. Accordingly, the time required for each load element 410 to adjust the signal delay on delay line 402 may be controlled by selecting appropriate RC values for the filter circuit, thereby allowing present embodiments to be configured differently (e.g., for different applications).

Figure 5:
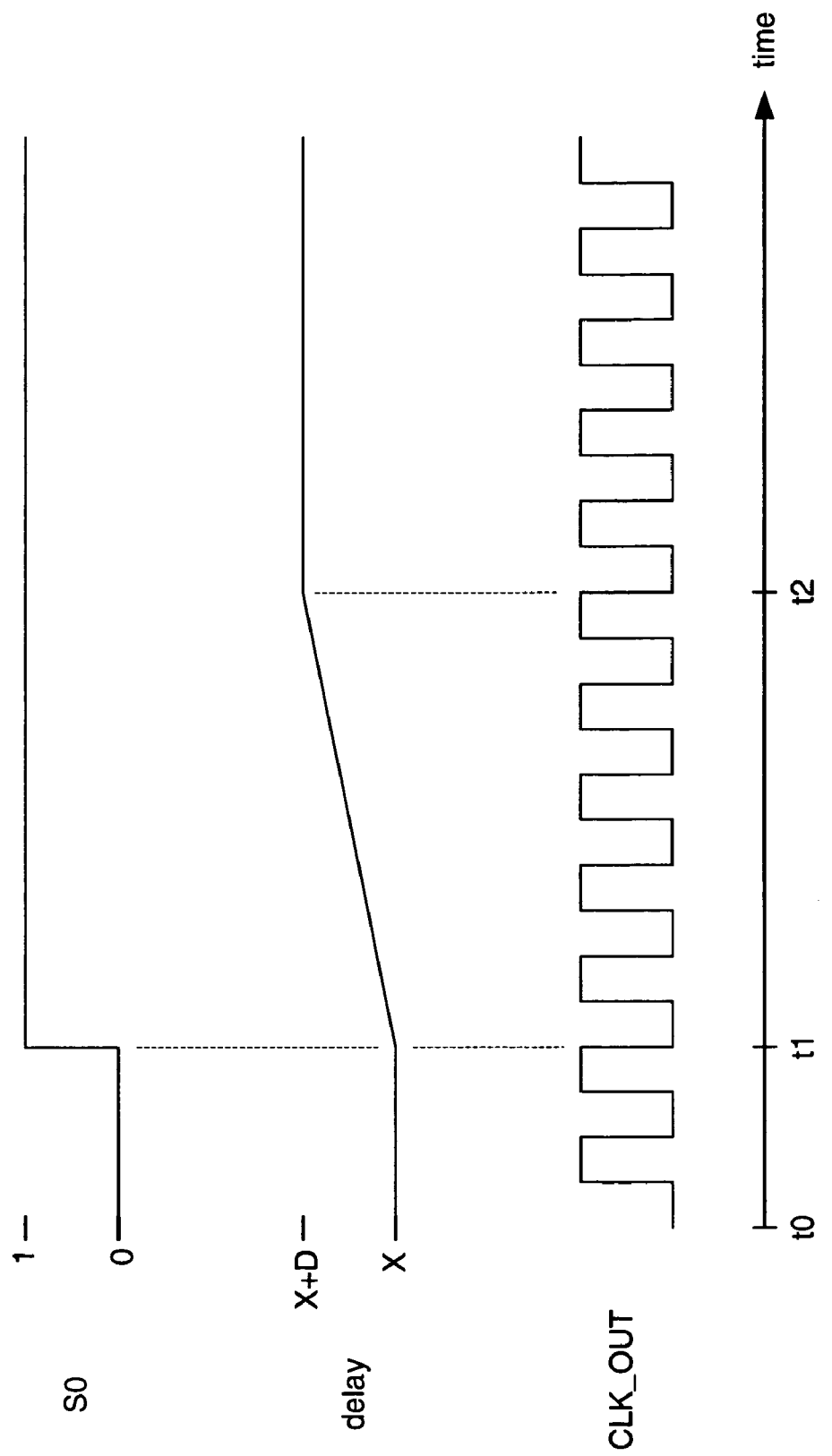
FIG. 5 is an exemplary waveform diagram illustrating phase-delay adjustments for one embodiment of the trim unit of FIG. 4.

For example, referring to the illustrative waveform diagram of FIG. 5, at time t0, there is a phase-delay of X between CLK_OUT and CLK_IN, and the de-asserted states of select signals S0–S3 disable corresponding load elements 410(0)–410(3) so that trim unit 400 initially provides a minimum (e.g., zero) phase-delay adjustment. At time t1, select signal S0 is asserted from logic low to logic high (e.g., from ground potential to the supply voltage VDD) to enable load element 410(0). When S0 is transitioned from logic low to logic high, the filter circuit 412(0) gradually increases the gate voltage of select transistor MN0 at a rate determined by the RC time constant of filter circuit 412(0). In response thereto, select transistor MN0 gradually turns on and provides a gradually increasing current that gradually charges load capacitor CL0, which in turn gradually increases the phase-delay between CLK_OUT and CLK_IN from X at time t1 to X+D at time t2. As depicted in the exemplary waveform of FIG. 5, the increase in phase-delay between CLK_OUT and CLK_IN realized by enabling load element 410(0) is spread out over five clock periods. Thus, rather than increasing the clock phase-delay in fairly instantaneous manner, trim unit 400 gradually increases the clock phase-delay and therefore reduce jitter during trim adjustments, for example, as compared to prior art trim unit 220 of FIG. 2.

As mentioned above, the rate at which load element 410(0) adjusts the phase-delay of CLK_OUT is determined by the RC time constant of filter circuit 412(0), and therefore may be adjusted by modifying the values of R0 and CF0. Thus, although load element 410(0) is discussed above with respect to the exemplary waveforms of FIG. 5 as taking five clock cycles to increase the phase-delay by the delay amount D, for other embodiments, filter circuit 412(0) may be configured with other values for R0 and CF0 so that load element 410(0) takes some other suitable number of clock cycles to increase the phase-delay by the delay amount D.

Additional load elements 410(1)–410(3) of trim unit 400 may be selectively enabled to further increase the phase-delay of CLK_OUT with respect to CLK_IN by selectively asserting select signals S1–S3, respectively. Because the operation of load elements 410(1)–410(3) is similar to that described above with respect to load element 410(0), individual descriptions of load elements 410(1)–410(3) are not provided herein for brevity.

Figure 1:
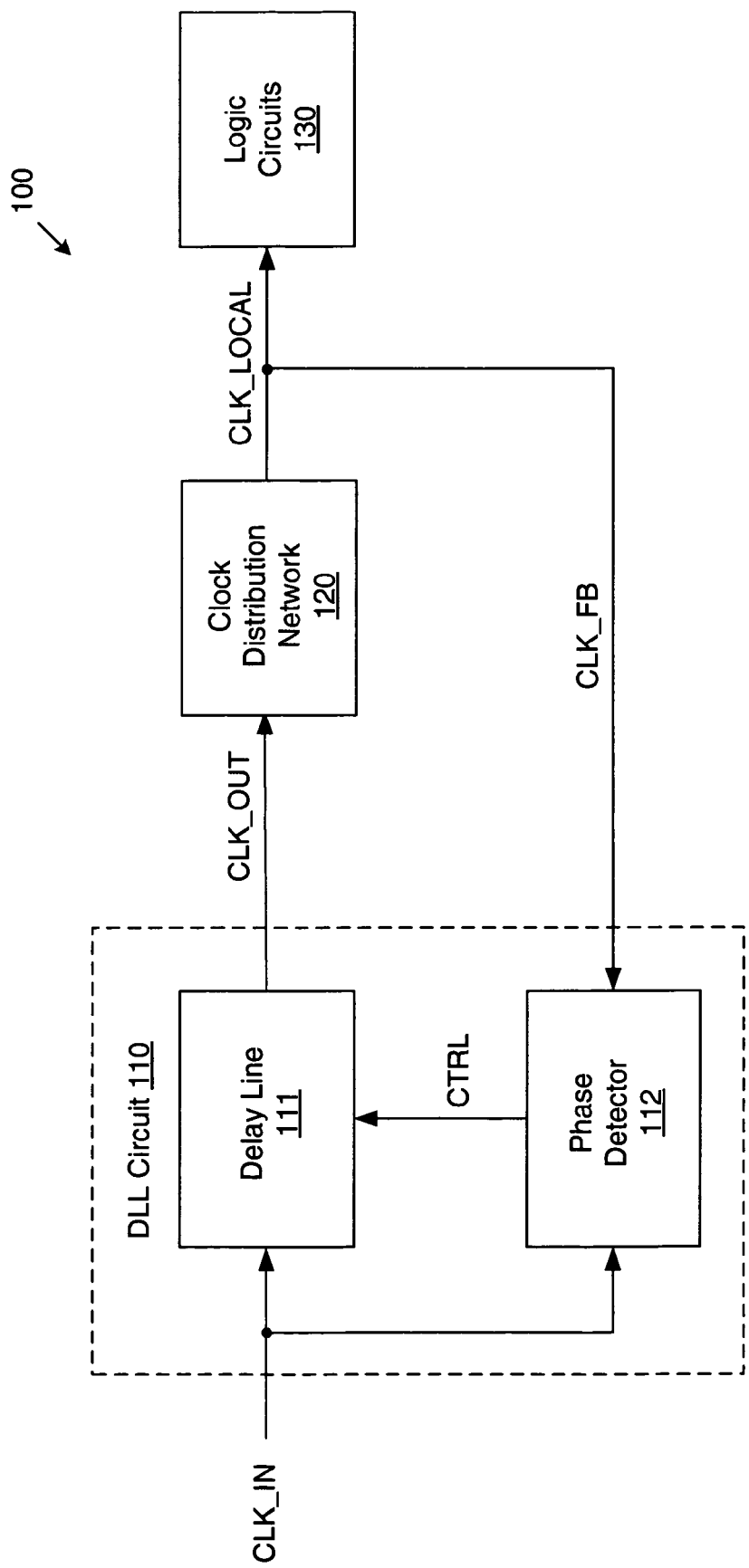
FIG. 1 is a block diagram of a digital system including a conventional delay-locked loop (DLL) circuit.
Figure 2:
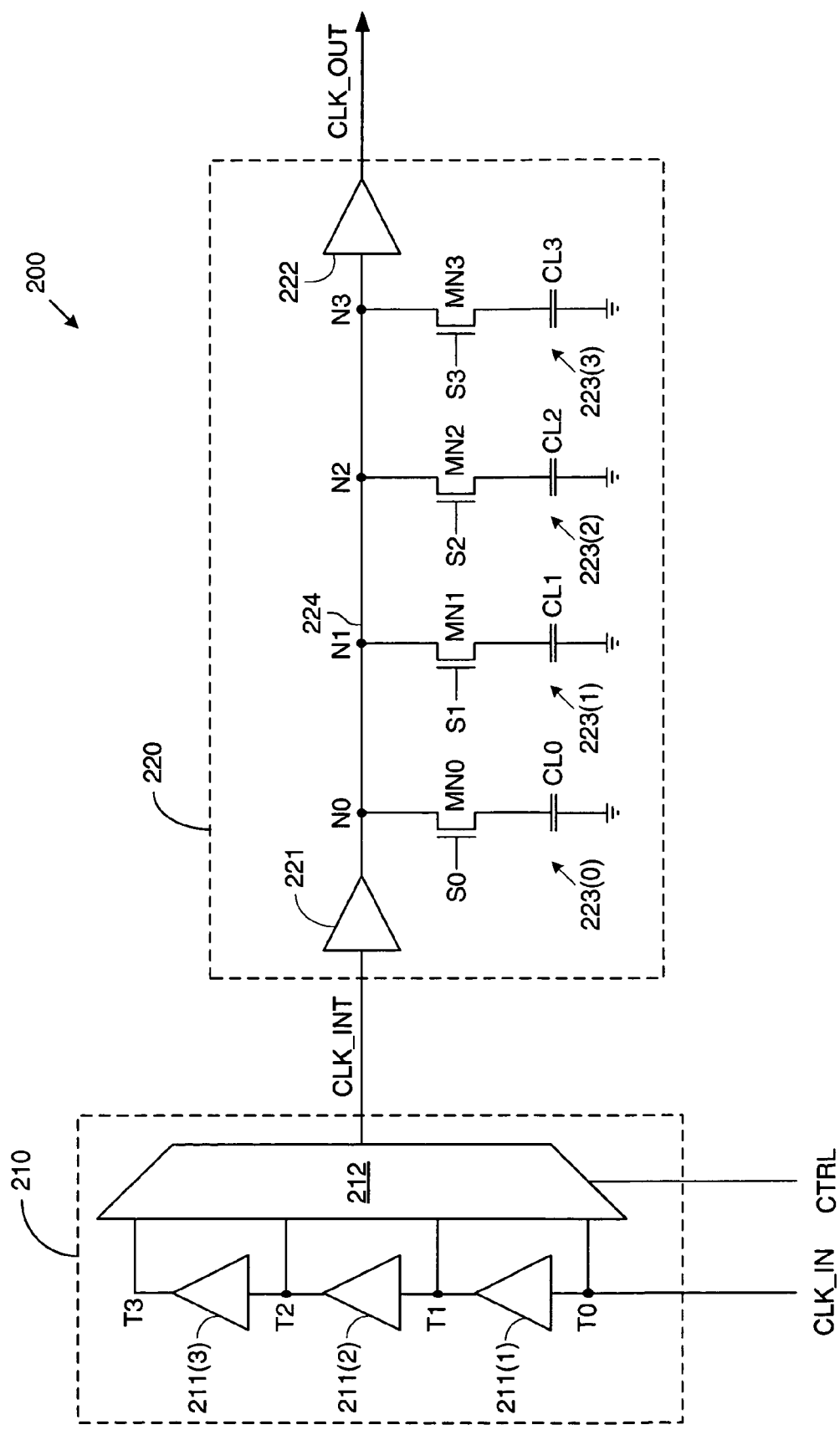
FIG. 2 is a circuit diagram of the delay line of the conventional DLL circuit of FIG. 1.
Figure 3:
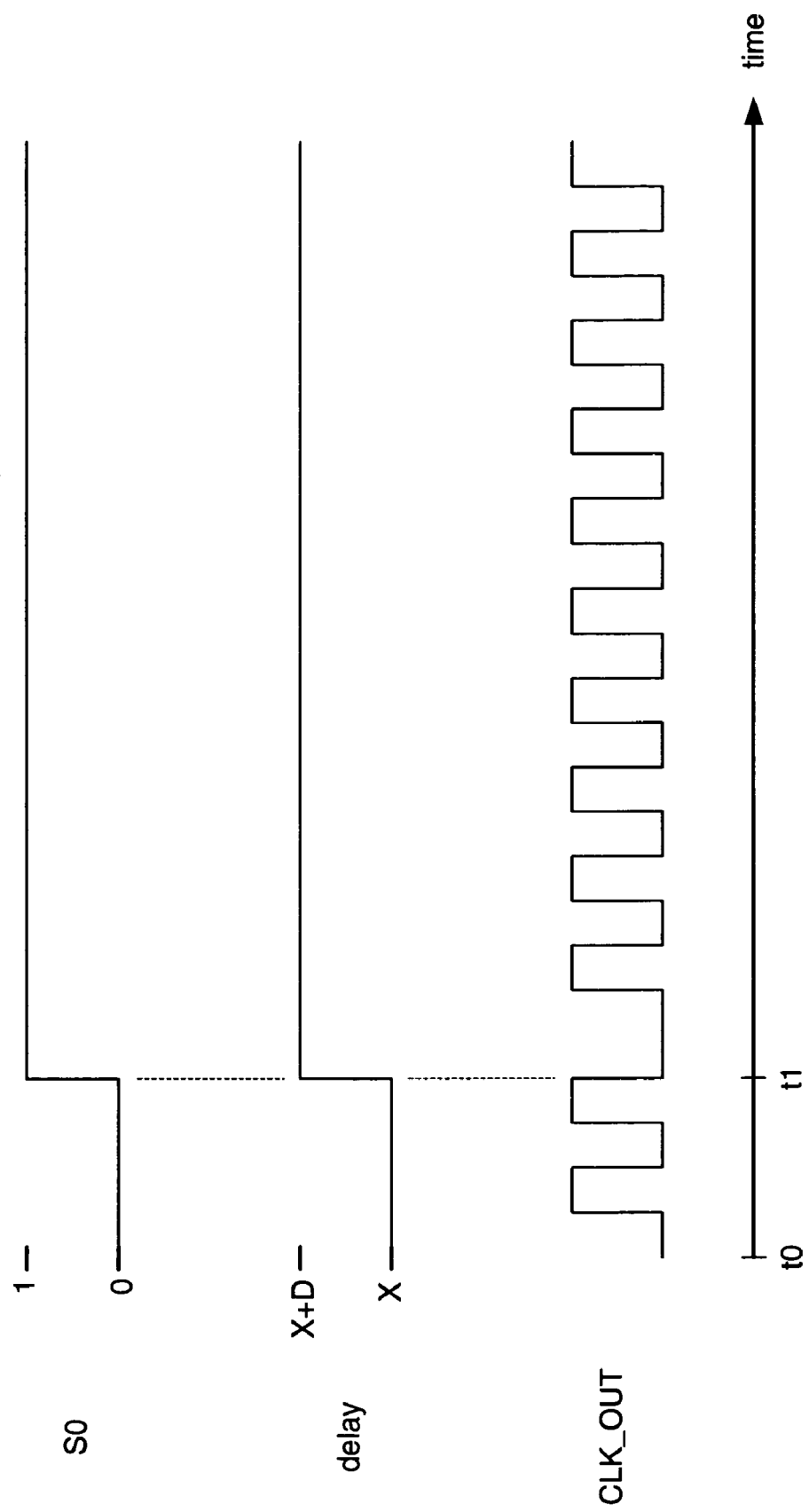
FIG. 3 is an exemplary waveform diagram illustrating phase-delay adjustments provided by the trim unit of FIG. 2.
Figure 6:
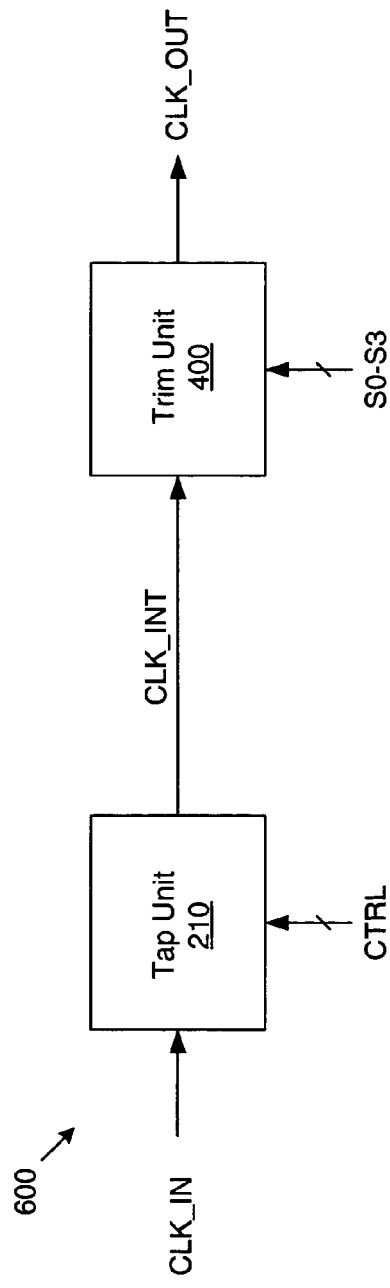
FIG. 6 is a block diagram of an exemplary delay line formed using the trim unit of FIG. 4.

As mentioned above, trim unit 400 may be combined with a well-known tap unit such as tap unit 210 of FIG. 2 to form a delay line, for example, as shown in FIG. 6. However, because load elements 410 of trim unit 400 are configured to gradually adjust the phase-delay between CLK_OUT and CLK_IN over many clock cycles, an undesirable rollover or overshoot condition may occur when tap unit 210 and trim unit 400 are simultaneously used to adjust the clock phase-delay.

Figure 7:
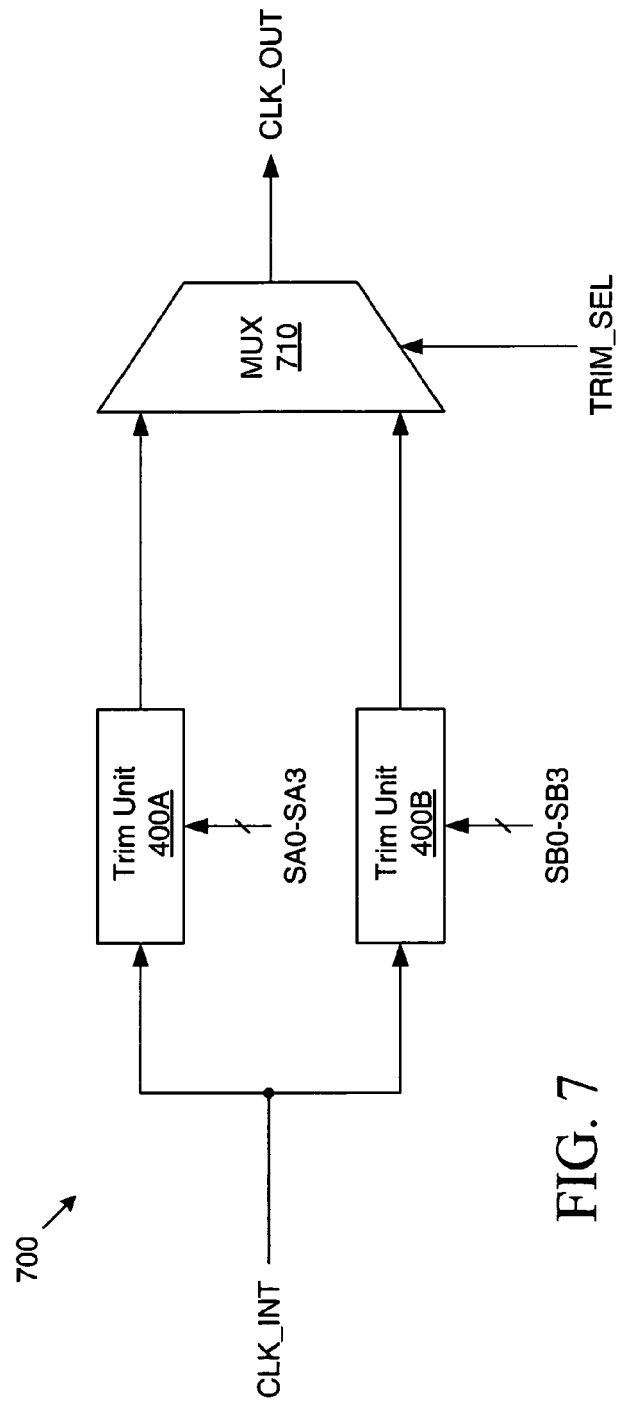
FIG. 7 is a block diagram of a trim circuit in accordance with another embodiment of the present invention.

Thus, FIG. 7 shows a trim circuit 700 in accordance with another embodiment of the present invention. Trim circuit 700, which includes a first trim unit 400A, a second trim unit 400B, and a multiplexer (MUX) 710, may be used with tap unit 210 to eliminate undesirable output spikes during concurrent tap and trim adjustments. First trim unit 400A includes an input to receive CLK_INT (e.g., from tap unit 210 of delay line 600), control inputs to receive a first set of select signals SA0–SA3, and an output coupled to a first input of MUX 710. Second trim unit 400B includes an input to receive CLK_INT, control inputs to receive a second set of select signals SB0–SB3, and an output coupled to a second input of MUX 710. For some embodiments, trim units 400A and 400B are identical to trim unit 400 of FIG. 4. Thus, first trim unit 400A may be used to gradually adjust the phase-delay between CLK_OUT and CLK_IN (e.g., in 20 ps increments) by selectively asserting corresponding select signals SA0–SA3, and second trim unit 400B may be used to gradually adjust the phase-delay between CLK_OUT and CLK_IN (e.g., in 20 ps increments) by selectively asserting corresponding select signals SB0–SB3, as described above with respect to FIGS. 4 and 5. MUX 710, which may be any suitable multiplexer circuit, includes an output to generate CLK_OUT and a control terminal to receive a trim select signal TRIM_SEL.

In accordance with an embodiment of the present invention, first and second trim units 400A and 400B may be alternately selected by TRIM_SEL via MUX 710 to provide trim adjustments between alternating pairs of taps of tap unit 210 to avoid overshoot conditions during concurrent tap and trim adjustments. Thus, for some embodiments, first trim unit 400A may be selected for trim adjustments when an even number of taps in tap unit 210 are selected, and second trim unit 400B may be selected for trim adjustments when an odd number of taps in tap unit 210 are selected. Of course, for other embodiments, first trim unit 400A may be selected for trim adjustments when an odd number of taps in tap unit 210 are selected, and second trim unit 400B may be selected for trim adjustments when an even number of taps in tap unit 210 are selected.

Figure 8:
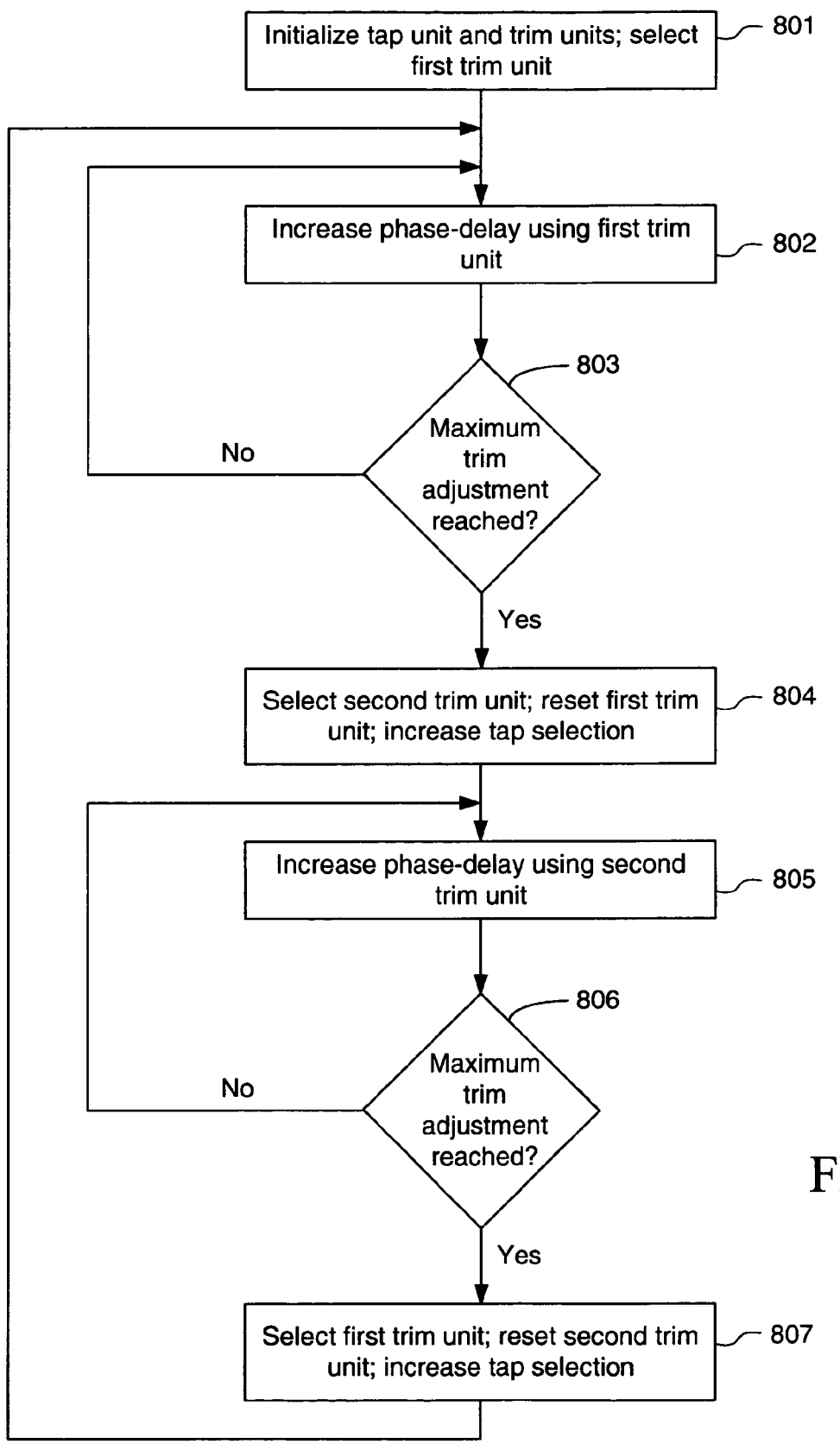
FIG. 8 is a flow chart illustrating an exemplary operation of one embodiment of a delay line including the trim circuit of FIG. 7.

An exemplary operation of one embodiment of trim circuit 700 configured for use with tap unit 210 is described below with respect to the illustrative flow chart of FIG. 8. First, tap unit 210 and trim units 400A and 400B of trim circuit 700 are initialized to predetermined states, and TRIM_SEL is asserted (e.g., to logic high) to select first trim unit 400A (step 801). For example, referring also to FIGS. 2 and 4, the control signal CTRL is initialized to a state that selects tap T0 of tap unit 210, and the select signals SA0–SA3 and SB0–SB3 are de-asserted so that none of the load elements 410 within first and second trim units 400A and 400B are enabled. Thus, for this initial configuration, tap unit 210 and trim circuit 700 each provide a minimum (e.g., zero) phase-delay adjustment.

Then, first trim unit 400A may be used to gradually increase the phase-delay between CLK_OUT and CLK_IN in 20 ps increments by selectively asserting select signals SA0–SA3 (step 802). Then, when all load elements in first trim unit 400A are enabled such that first trim unit 400A provides a maximum delay (e.g., 80 ps), as tested at step 803, tap unit 210 is used to further increase the phase-delay between CLK_OUT and CLK_IN (step 804). For example, to increase the phase-delay from 80 ps to 100 ps, TRIM_SEL is de-asserted (e.g., to logic low) to select second trim unit 400B, which as discussed above is initialized to provide a zero phase-delay. Further, the tap selection of tap unit 210 is changed from T0 to T1 so that tap unit 210 provides an 80 ps phase-delay, and the first select signals SA0–SA3 are de-asserted to disable the load elements 410 within first trim unit 400A. Thereafter, second trim unit 400B may be used to gradually increase the phase-delay between CLK_OUT and CLK_IN in 20 ps increments by selectively asserting second select signals SB0–SB3 (step 805).

By switching the trim selection from the first trim unit 400A to the second trim unit 400B prior to changing the tap selection from tap T0 to T1, the phase-delay provided by trim circuit 700 may be instantaneously reduced from its maximum value to its minimum value (e.g., from 80 ps to 0 ps) during tap adjustments, thereby eliminating the undesirable spikes in phase-delay during concurrent tap and trim adjustments. Further, while second trim unit 400B is being used to increase the phase-delay between CLK_OUT and CLK_IN, the phase-delay provided by first trim unit 400A may settle to its minimum value (e.g., zero) in response to the de-assertion of first select signals SA0–SA3.

Once the maximum phase-delay adjustment provided by second trim unit 400B is reached, as tested at step 806, the tap unit 210 is again used to further increase the phase-delay between CLK_OUT and CLK_IN (step 807). For example, to increase the phase-delay from 160 ps to 180 ps, TRIM_SEL is re-asserted to select first trim unit 400A, the tap selection of tap unit 210 is changed from T1 to T2 so that tap unit 210 provides a 160 ps phase-delay, and the second select signals SB0–SB3 are de-asserted to disable the load elements 410 within second trim unit 400B. Thereafter, first trim unit 400A may be used to gradually increase the phase-delay between CLK_OUT and CLK_IN in 20 ps increments by selectively asserting first select signals SA0–SA3 (step 802).

Thus, by switching the trim selection from the second trim unit 400B to the first trim unit 400A prior to changing the tap selection from tap T1 to tap T2, the phase-delay provided by trim circuit 700 may be fairly instantaneously reduced to zero, thereby eliminating overshoot conditions. Further, while first trim unit 400A is being used to increase the phase-delay between CLK_OUT and CLK_IN, the phase-delay provided by second trim unit 400B may settle to a minimum (e.g., zero) value in response to the de-assertion of second select signals SB0–SB3. Thereafter, operation of delay line 600 may continue in the manner described above, with the first and second trim units 400A and 400B being alternately selected for trim adjustments.

The trim select signal TRIM_SEL may be generated using well-known circuitry. For some embodiments, TRIM_SEL may be generated in response to logic state changes of the control signal CTRL so that TRIM_SEL is toggled in response to tap selection changes of tap unit 210. For other embodiments, TRIM_SEL may be generated by other suitable circuitry.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. A trim unit for selectively adjusting a phase-delay between an input clock signal and an output clock signal, comprising:
    a delay line having a first end to receive the input clock signal and having a second end to generate the output clock signal; and
    one or more individually selectable load elements, each comprising:
        a select transistor and a load capacitor coupled in series between the delay line and ground potential; and
        a filter circuit having an input to receive a corresponding select signal and having an output coupled to a gate of the select transistor.

2. The trim unit of claim 1, wherein the filter circuit comprises:
    a resistor coupled between the input of the filter circuit and the gate of the select transistor; and
    a filter capacitor coupled between the gate of the select transistor and ground potential.

3. The trim unit of claim 1, wherein upon assertion of the select signal, the filter circuit gradually charges the gate of the select transistor to gradually turn on the select transistor, which in turn gradually charges the load capacitor to gradually increase the phase-delay between the output signal and the input clock signal.

4. The trim unit of claim 2, wherein the filter circuit has an associated resistor-capacitor (RC) time constant, and the rate at which the load element adjusts the phase-delay between the output clock signal and the input clock signal is determined by the RC time constant.

5. The trim unit of claim 1 wherein the delay line is part of a delay-locked loop (DLL) circuit.

6. The trim unit of claim 5 wherein the delay-locked loop (DLL) is part of a Programmable Logic Device (PLD).

7. A circuit for selectively adjusting a phase-delay between an input clock signal and an output clock signal, comprising:
    a first trim unit having an input to receive the input clock signal via a first delay line and including one or more first load elements each selectable to adjust the phase-delay by a predetermined amount in response to a corresponding first select signal;
    a second trim unit having an input to receive the input clock signal via a second delay line and including one or more second load elements each selectable to adjust the phase-delay by a predetermined amount in response to a corresponding second select signal; and
    a multiplexer having a first input coupled to the first delay line, a second input coupled to the second delay line, an output to generate the output clock signal, and a control terminal to receive a trim select signal;
    wherein assertion of the trim select signal enables the first trim unit and disables the second trim unit, and de-assertion of the trim select signal disables the first trim unit and enables the second trim unit.

8. The circuit of claim 7, further comprising:
    a tap unit having an input to receive the input clock signal and having an output coupled to the inputs of the first and second trim units, the tap unit including a plurality of individually selectable taps responsive to a control signal.

9. The circuit of claim 8, wherein the trim select signal is toggled between the asserted state and the de-asserted state in response to tap selection changes in the tap unit.

10. The circuit of claim 8, wherein the trim select signal is responsive to the control signal.

11. The circuit of claim 7, wherein:
    each of the first load elements comprises:
        a first select transistor and a first load capacitor coupled in series between the first delay line and ground potential; and
        a first filter circuit having an input to receive a corresponding first select signal and having an output coupled to a gate of the first select transistor; and
    each of the second load elements comprises:
        a second select transistor and a second load capacitor coupled in series between the second delay line and ground potential; and
        a second filter circuit having an input to receive a corresponding second select signal and having an output coupled to a gate of the second select transistor.

12. The circuit of claim 11, wherein upon assertion of the first select signal, the first filter circuit gradually charges the gate of the first select transistor to gradually turn on the first select transistor, which in turn gradually charges the first load capacitor to gradually increase the phase-delay between the output signal and the input clock signal.

13. The circuit of claim 11, wherein the first filter circuit has an associated resistor-capacitor (RC) time constant, and the rate at which the first load element adjusts the phase-delay between the output clock signal and the input clock signal is determined by the RC time constant.

14. The circuit of claim 7 wherein the first trim unit is part of a programmable logic device.

15. A method of operating a delay line that selectively adjusts a phase-delay between an output clock signal and an input clock signal, the method comprising:
    providing a tap unit having one or more taps for selectively adjusting the phase-delay by one or more relatively large increments;
    providing a first trim unit having one or more first load elements for selectively adjusting the phase-delay by one or more relatively small increments;

providing a second trim unit having one or more second load elements for selectively adjusting the phase-delay by one or more relatively small increments;

selecting the first trim unit for trim adjustments when an odd number of the taps of the tap unit are selected; and selecting the second trim unit for trim adjustments when an even number of the taps of the tap unit are selected.

16. The method of claim 15, further comprising:

disabling the load elements in the first trim unit when the second trim unit is selected; and disabling the load elements in the second trim unit when the first trim unit is selected.

17. The method of claim 16, further comprising:

providing a control signal to control selection of the taps in the tap unit;

providing a trim select signal to select either the first or second trim unit for the trim adjustments; and selectively toggling the trim select signal in response to logic state transitions of the control signal.

\* \* \* \* \*